US009318728B2

(12) United States Patent
Aonuma

(10) Patent No.: US 9,318,728 B2
(45) Date of Patent: Apr. 19, 2016

(54) METHOD FOR PRODUCING ORGANIC LIGHT-EMITTING ELEMENT, METHOD FOR AGING ORGANIC LIGHT-EMITTING ELEMENT, ORGANIC LIGHT-EMITTING ELEMENT, ORGANIC LIGHT-EMITTING DEVICE, ORGANIC DISPLAY PANEL, AND ORGANIC DISPLAY DEVICE

(75) Inventor: Masaki Aonuma, Fukuoka (JP)

(73) Assignee: JOLED INC., Tokyo (JP)

( * ) Notice: Subject to any disclaimer, the term of this patent is extended or adjusted under 35 U.S.C. 154(b) by 155 days.

(21) Appl. No.: 14/114,255

(22) PCT Filed: May 27, 2011

(86) PCT No.: PCT/JP2011/002967
§ 371 (c)(1),
(2), (4) Date: Oct. 28, 2013

(87) PCT Pub. No.: WO2012/164598
PCT Pub. Date: Dec. 6, 2012

(65) Prior Publication Data
US 2014/0138658 A1 May 22, 2014

(51) Int. Cl.
*H01L 51/52* (2006.01)
*H01L 51/56* (2006.01)
*H05B 33/10* (2006.01)

(52) U.S. Cl.
CPC ............... *H01L 51/56* (2013.01); *H05B 33/10* (2013.01); *H01L 2251/562* (2013.01)

(58) Field of Classification Search
None
See application file for complete search history.

(56) References Cited

U.S. PATENT DOCUMENTS

| 5,443,922 | A | 8/1995 | Nishizaki et al. |
| 6,626,717 | B2 | 9/2003 | Miyashita et al. |
| 7,355,574 | B1 * | 4/2008 | Leon et al. ............... 345/82 |
| 7,553,207 | B2 | 6/2009 | Uhlig et al. |
| 2002/0123291 | A1 | 9/2002 | Miyashita et al. |
| 2004/0164668 | A1 | 8/2004 | Kanno et al. |
| 2005/0280361 | A1 | 12/2005 | Uhlig et al. |
| 2012/0132935 | A1 | 5/2012 | Isobe et al. |

FOREIGN PATENT DOCUMENTS

| JP | 05-163488 | 6/1993 |
| JP | 08-185979 | 7/1996 |
| JP | 10-208880 | 8/1998 |

(Continued)

OTHER PUBLICATIONS

English translation of JP 2008-235139.*

(Continued)

*Primary Examiner* — Pamela E Perkins
(74) *Attorney, Agent, or Firm* — Greenblum & Bernstein, P.L.C.

(57) ABSTRACT

A manufacturing method for an organic light-emitting element includes: a first step of forming a first electrode, and forming an organic layer including a light-emitting layer; a second step of forming a second electrode, and thereby forming an element structure including the first electrode, the organic layer, and the second electrode; and a third step of performing an aging process by applying electric power between the first electrode and the second electrode in the element structure. a duration of the application of electric power in the third step is determined as the time elapsed before a time point at which a rate of decrease in a luminance of the light-emitting layer is substantially equal to a rate of decrease in a luminance of the element structure.

9 Claims, 8 Drawing Sheets

(56) References Cited

FOREIGN PATENT DOCUMENTS

| JP | 2002-198172 | 7/2002 |
| JP | 2002-203672 | 7/2002 |
| JP | 2003-280547 | 10/2003 |
| JP | 2003-323979 | 11/2003 |
| JP | 2005-222915 | 8/2005 |
| JP | 2005-276677 | 10/2005 |
| JP | 2006-012786 | 1/2006 |
| JP | 2007-012464 | 1/2007 |
| JP | 2008-235139 | * 10/2008 ............ H05B 33/10 |
| JP | 2010-086702 | 4/2010 |

OTHER PUBLICATIONS

U.S. Appl. No. 14/008,636 to Masaki Aonuma et al., filed Sep. 30, 2013.

U.S. Appl. No. 14/009,367 to Masaki Aonuma, filed Oct. 2, 2013.

International Search Report (ISR) in International Patent Application No. PCT/JP2011/002967, dated Aug. 9, 2011.

* cited by examiner

METHOD FOR PRODUCING ORGANIC LIGHT-EMITTING ELEMENT, METHOD FOR AGING ORGANIC LIGHT-EMITTING ELEMENT, ORGANIC LIGHT-EMITTING ELEMENT, ORGANIC LIGHT-EMITTING DEVICE, ORGANIC DISPLAY PANEL, AND ORGANIC DISPLAY DEVICE

TECHNICAL FIELD

The present invention relates to a manufacturing method for an organic light-emitting element, an aging method for an organic light-emitting element, an organic light-emitting element, an organic light-emitting device, an organic display panel, and an organic display device.

BACKGROUND ART

In recent years, progress has been made in the research and development of organic light-emitting elements, which are light-emitting elements that rely on the phenomenon of electroluminescence of solid fluorescent substance. An organic light-emitting element includes a substrate, an interlayer insulation film, an anode, and a hole injection layer, which are formed in the stated order. A bank made of insulating material is formed to surround a peripheral edge of the hole injection layer. In an opening defined by the bank, a hole transport layer, a light-emitting layer, and an electron transport layer are layered. Furthermore, a cathode is formed on the electron transport layer. In the organic light-emitting element, the structure including the layers from the anode to the cathode corresponds to an element structure.

Manufacturing of the organic light-emitting element includes an aging process in which electric current is applied between the anode and the cathode in the element structure. The aging process is important in order to suppress degradation of the organic light-emitting element over time, to stabilize the light-emitting properties, and to increase the lifetime of the organic light-emitting element. Accordingly, various types of research and development have been conducted on an aging process (e.g., Patent Literatures 1 and 2).

CITATION LIST

Patent Literature

[Patent Literature 1]
Japanese Patent Application Publication No. H08-185979
[Patent Literature 2]
Japanese Patent Application Publication No. H10-208880

SUMMARY OF THE INVENTION

Technical Problem

However, conventional manufacturing methods for an organic light-emitting element do not include a clear definition on an optimum aging duration for stabilizing light-emitting properties and increasing a lifetime.

The present invention has been achieved in view of the above problem, and an aim thereof is to define an optimum aging duration, and thereby to provide a manufacturing method for an organic light-emitting element, an aging method for an organic light-emitting element, an organic light-emitting element, an organic light-emitting device, an organic display panel, and an organic display device that are each excellent in terms of stability of light-emitting properties and a long lifetime.

Solution to Problem

One aspect of the present invention is a manufacturing method for an organic light-emitting element, comprising: forming a first electrode, and forming, in correspondence with the first electrode, an organic layer including a light-emitting layer (a first step); forming a second electrode in correspondence with the organic layer, and thereby forming an element structure including the first electrode, the organic layer, and the second electrode (second step); and performing an aging process by applying electric power between the first electrode and the second electrode in the element structure (a third step). In the third step, electric power is applied for a duration determined based on a rate of decrease in a luminance of the light-emitting layer and a rate of decrease in a luminance of the element structure.

Advantageous Effects of Invention

Concerning the manufacturing method for an organic light-emitting element as described above, in the third step, electric power is applied for the duration determined based on the rate of decrease in the luminance of the light-emitting layer and the rate of decrease in the luminance of the element structure. This allows for the manufacturing of an organic light-emitting element that is excellent in terms of stability of light-emitting properties and a long lifetime. In other words, in the manufacturing method for an organic light-emitting element according to an aspect of the present invention, a focus is placed not only on the rate of decrease in the luminance of the element structure, but also on the rate of decrease in the luminance of the light-emitting layer, and the duration of the aging process is defined based on the close correlation between these rates of decrease. This produces an advantageous effect in terms of defining an optimum aging duration.

BRIEF DESCRIPTION OF DRAWINGS

FIG. 7A shows an initial stage of the weakening of electric current, and FIG. 7B shows an intermediate stage, after the initial stage, of the weakening of electric current.

DESCRIPTION OF EMBODIMENTS

Figure 1:
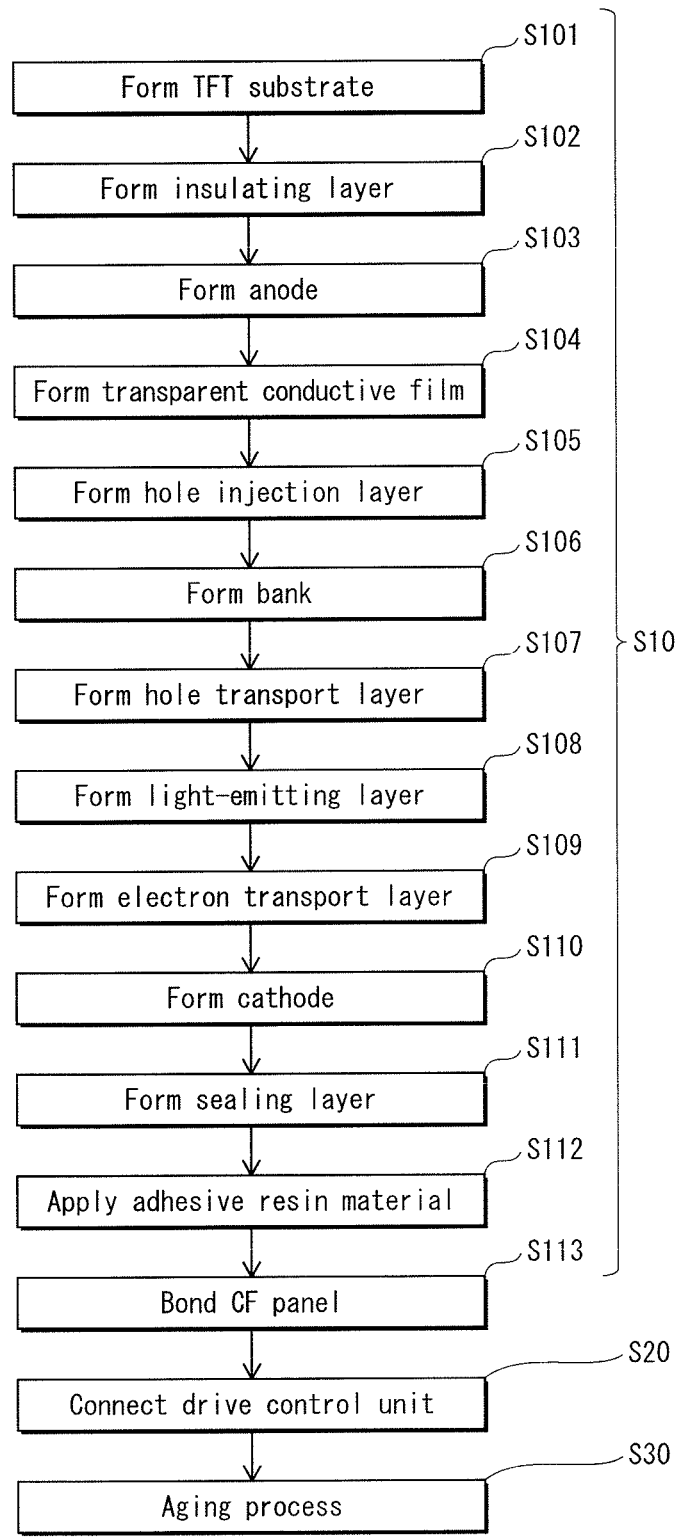
FIG. 1 is a schematic process chart showing the steps of manufacturing an organic display device 1 according to Embodiment 1 of the present invention.

Process by which Aspect of the Present Invention was Achieved

The present inventor has continued the research on the aging of an organic light-emitting element. During the research, the present inventor has found the following point regarding the degradation rate of an element structure. That is, the element structure is degraded sharply in an initial stage of the application of electric power. However, after the elapse of a certain amount of time since the start of the application of electric power, the element structure is degraded gradually and, from this point onwards, the degradation rate of the element structure is deeply related to the degradation rate of a light-emitting layer. Accordingly, in the present invention, aging duration is defined based on: the rate of decrease in the luminance of the light-emitting layer; and the rate of decrease in the luminance of the element structure. More specifically, the present inventor has found that although the element structure degrades to a greater extent than the light-emitting layer in the initial stage, the degradation of the element structure is defined by that of the light-emitting layer after the initial stage of degradation.

Aspects of Present Invention

One aspect of the present invention is a manufacturing method for an organic light-emitting element, comprising: a first step of forming a first electrode, and forming, in correspondence with the first electrode, an organic layer including a light-emitting layer; a second step of forming a second electrode in correspondence with the organic layer, and thereby forming an element structure including the first electrode, the organic layer, and the second electrode; and a third step of performing an aging process by applying electric power between the first electrode and the second electrode in the element structure, wherein in the third step, electric power is applied for a duration determined based on a rate of decrease in a luminance of the light-emitting layer and a rate of decrease in a luminance of the element structure.

As described above, a focus is placed on the relationship between the rate of decrease in the luminance of the element structure and the rate of decrease in the light-emitting layer. In this way, the duration of the aging process (duration of the application of electric power) can be defined clearly based on this relationship, allowing for the manufacturing of an organic light-emitting element having stable light-emitting properties and a long lifetime.

In the above, the "luminance of the element structure" refers to the luminance when electric current is applied between the first electrode and the second electrode. On the other hand, the "luminance of the light-emitting layer" refers to the luminance of excitation light emitted from the light-emitting layer, when electric current is not applied between the first electrode and the second electrode and the light-emitting layer is energized from an external source (e.g., the light-emitting layer may be irradiated with UV light by means of a UV lamp). In other words, according to an aspect of the present invention, the luminance of photoluminescence (PL) light emission and the luminance of electroluminescence (EL) light emission are both taken into consideration. The same applies hereafter.

More specifically, concerning the manufacturing method according to an aspect of the present invention, in the third step, electric power is applied until the rate of decrease in the luminance of the light-emitting layer is substantially equal to the rate of decrease in the luminance of the element structure.

In the above, "substantially equal to" refers to a state where the difference between the rate of decrease in the luminance of the light-emitting layer and the rate of decrease in the luminance of the element structure is equal to or less than 20%. More preferably, the difference therebetween is equal to or less than 10%.

As described above, the aging duration (the duration of the application of electric power in the third step) is set to the time that elapses before the rate of decrease in the luminance of the light-emitting layer is substantially equal to the rate of decrease in the luminance of the element structure (the difference is equal to or less than 20% and more preferably equal to or less than 10%). In this way, the rate of decrease in the luminance of the element structure after the aging process becomes substantially equal to the rate of decrease in the luminance of the light-emitting layer. In other words, in a graph whose horizontal axis represents the time elapsed since the start of the application of electric power and whose vertical axis represents luminance, a curve representing the transition of the luminance of the element structure becomes substantially parallel to a curve representing the transition of the luminance of the light-emitting layer after the aging process. After these curves are substantially parallel to each other, the degradation of the element structure greatly depends on the degradation of the light-emitting layer.

As described above, in the manufacturing method for an organic light-emitting element according to an aspect of the present invention, the aging duration (duration of the application of electric power in the third step) is set to the time that elapses before the rate of decrease in the luminance of the light-emitting layer is substantially equal to the rate of decrease in the luminance of the element structure. This allows for the manufacturing of an organic light-emitting element having stable light-emitting properties and a long lifetime.

Concerning the manufacturing method according to an aspect of the present invention, the duration of the application of electric power in the third step is determined with use of a duration determination element that differs from the organic light-emitting element subjected to the aging process and that has the same structure as the organic light-emitting element. Also, the duration of the application of electric power in the third step is determined by: measuring a luminance of a light-emitting layer of the duration determination element at predetermined intervals from start of the application of electric power, and measuring a luminance of an element structure of the duration determination element at the predetermined intervals; based on a result of the measurement, calculating a rate of decrease in a luminance of the light-emitting layer of the duration determination element for each of the predetermined intervals, and calculating a rate of decrease in a luminance of the element structure of the duration determination element structure for each of the predetermined intervals; and calculating a time point at which the rate of decrease in the luminance of the light-emitting layer of the duration determination element is substantially equal to the rate of decrease in the luminance of the element structure of the duration determination element structure.

Such specific steps as described above allows for setting of an optimum aging duration and manufacturing an organic light-emitting element having stable light-emitting properties and a long lifetime.

As described above, prior to the actual manufacturing of an organic light-emitting element, the optimum aging duration (the duration of the application of electric power in the third step) is defined with use of the duration determination element. This allows for manufacturing of an organic light-emitting element with high efficiency.

Note that the "duration determination element" may refer to an element immediately before the element subjected to the aging process in the third step or, alternatively, may refer to the first element in each lot or in each model, for example. In a case where manufacturing equipment or a manufacturing process is modified, the duration of the aging process may be determined with use of the element that is to be initially sent to the manufacturing line. Then, according to the duration thus determined, the aging process may be performed on the element subsequently sent to the manufacturing line (manufacturing process).

An aspect of the present invention is a manufacturing method for an organic light-emitting element, comprising: a first step of forming a first electrode, and forming, in correspondence with the first electrode, an organic layer including a light-emitting layer; a second step of forming a second electrode in correspondence with the organic layer, and thereby forming an element structure including the first electrode, the organic layer, and the second electrode; and a third step of performing an aging process, by applying electric power between the first electrode and the second electrode in the element structure for a predetermined duration, wherein the predetermined duration in the third step is determined with use of a duration determination element that differs from the organic light-emitting element subjected to the aging process and that has the same structure as the organic light-emitting element. Also, the predetermined duration in the third step is determined by: measuring a luminance of a light-emitting layer of the duration determination element at predetermined intervals from start of the application of electric power, and measuring a luminance of an element structure of the duration determination element at the predetermined intervals; based on a result of the measurement, calculating a rate of decrease in a luminance of the light-emitting layer of the duration determination element for each of the predetermined intervals, and calculating a rate of decrease in a luminance of the element structure of the duration determination element structure for each of the predetermined intervals; calculating a time point at which the rate of decrease in the luminance of the light-emitting layer of the duration determination element is substantially equal to the rate of decrease in the luminance of the element structure of the duration determination element structure; and associating the predetermined duration in the third step with the time point thus calculated.

In the above, a specific method is used to determine the duration of the aging process and to perform the aging process according to the duration thus determined. This also allows for the manufacturing of an organic light-emitting element having stable light-emitting properties and a long lifetime.

As described above, prior to the actual manufacturing of an organic light-emitting element, the optimum aging duration (the duration of the application of electric power in the third step) is defined with use of the duration determination element. This allows for manufacturing of an organic light-emitting element with high efficiency. The "duration determination element" is as defined above.

An aspect of the present invention is an aging method for an organic light-emitting element, comprising: a first step of preparing an organic light-emitting element including a first electrode, a second electrode, and an organic layer provided between the first electrode and the second electrode, the organic layer including a light-emitting layer; and a second step of applying electric power between the first electrode and the second electrode in the organic light-emitting element, wherein in the second step, electric power is applied for a duration until a rate of decrease in a luminance of the light-emitting layer for each of predetermined intervals from start of the application of electric power is substantially equal to a rate of decrease in a luminance of the organic light-emitting element for each of the predetermined intervals.

With the aging method of an organic light-emitting element according to an aspect of the present invention, electric power is applied for the duration until the rate of decrease in the luminance of the light-emitting layer is substantially equal to the rate of decrease in the luminance of the organic light-emitting element (corresponding to the element structure above), similarly to the above manufacturing method. This makes it possible to perform the optimum aging process, allowing for the manufacturing of an organic light-emitting element having stable light-emitting properties and a long lifetime.

Concerning the aging method according to an aspect of the present invention, the duration of the application of electric power in the second step is determined with use of a duration determination element, the duration determination element differing from the organic light-emitting element subjected to the second step and having the same structure as the organic light-emitting element. In the second step, electric power is applied from when a rate of decrease in a luminance of a light-emitting layer of the duration determination element for each of the predetermined intervals differs from a rate of decrease in a luminance of the duration determination element for each of the predetermined intervals, to when the rate of decrease in the luminance of the light-emitting layer is substantially equal to the rate of decrease in the luminance of the duration determination element.

With this structure, the aging process is performed for the duration (the duration of the application of electric power in the second step) from when the rate of decrease in the luminance of the light-emitting layer of the duration determination element for each of the predetermined intervals differs from the rate of decrease in the luminance of the duration determination element for each of the predetermined intervals, to when the rate of decrease in the luminance of the light-emitting layer is substantially equal to the rate of decrease in the luminance of the duration determination element. This also allows for the manufacturing of an organic light-emitting element having stable light-emitting properties and a long lifetime.

In the above, "substantially equal to" refers to a state where the difference between the rate of decrease in the luminance of the light-emitting layer and the rate of decrease in the luminance of the duration determination element is equal to or less than 20%. More preferably, the difference therebetween is equal to or less than 10%.

Concerning the manufacturing method according to an aspect of the present invention, the duration of the application of electric power in the second step is determined with use of a duration determination element, the duration determination element differing from the organic light-emitting element subjected to the second step and having the same structure as the organic light-emitting element. In the second step, electric power is applied from when a rate of decrease in a luminance of the duration determination element for each of the predetermined intervals is larger than a rate of decrease in a luminance of an organic light-emitting layer of the duration determination element for each of the predetermined intervals, to when the rate of decrease in the luminance of the duration determination element is substantially equal to the rate of decrease in the luminance of the organic light-emitting layer of the duration determination element.

With this structure, the aging process is performed for the duration (the duration of the application of electric power in the second step) from when the rate of decrease in the luminance of the duration determination element for each of the predetermined intervals is larger than the rate of decrease in the luminance of the organic light-emitting layer of the duration determination element for each of the predetermined intervals, to when the rate of decrease in the luminance of the duration determination element is substantially equal to the rate of decrease in the luminance of the organic light-emitting layer of the duration determination element. This also allows for the manufacturing of an organic light-emitting element having stable light-emitting properties and a long lifetime.

In the above, "substantially equal to" refers to a state where the difference between the rate of decrease in the luminance of the duration determination element and the rate of decrease in the luminance of the organic light-emitting layer of the duration determination element is equal to or less than 20%. More preferably, the difference therebetween is equal to or less than 10%.

One aspect of the present invention is an organic light-emitting device including an organic light-emitting element manufactured by any of the manufacturing methods described above.

As described above, an organic light-emitting element manufactured by any of the manufacturing methods described above has stable light-emitting properties and a long lifetime owing to the optimum aging process. Accordingly, the organic light-emitting device including the organic light-emitting element also has stable light-emitting properties and a long lifetime.

One aspect of the present invention is an organic display panel including an organic light-emitting element manufactured by any of the manufacturing methods described above.

As described above, an organic light-emitting element manufactured by any of the manufacturing methods described above has stable light-emitting properties and a long lifetime owing to the optimum aging process. Accordingly, the organic display panel including the organic light-emitting element also has stable light-emitting properties and a long lifetime.

One aspect of the present invention is an organic display device including an organic light-emitting element manufactured by any of the manufacturing methods described above.

As described above, an organic light-emitting element manufactured by any of the manufacturing methods described above has stable light-emitting properties and a long lifetime owing to the optimum aging process. Accordingly, the organic display device including the organic light-emitting element also has stable light-emitting properties and a long lifetime.

One aspect of the present invention is an organic light-emitting element, comprising: a first electrode; a second electrode; and an organic layer, including a light-emitting layer, provided between the first electrode and the second electrode, wherein the organic light-emitting element has been subjected to any of the aging methods described above.

As described above, each of the aforementioned aging methods makes it possible to perform the aging process for the optimum duration. Accordingly, an organic light-emitting element manufactured by any of the aging methods has stable light-emitting properties and a long lifetime.

The following describes the features of an aspect of the present invention, and the effects and advantages thereof, with use of some specific examples. Note that the present invention is in no way limited to the following embodiments except in its essential characteristic elements.

Embodiment 1

1. Manufacturing Method for Organic Display Device 1

Figure 2:
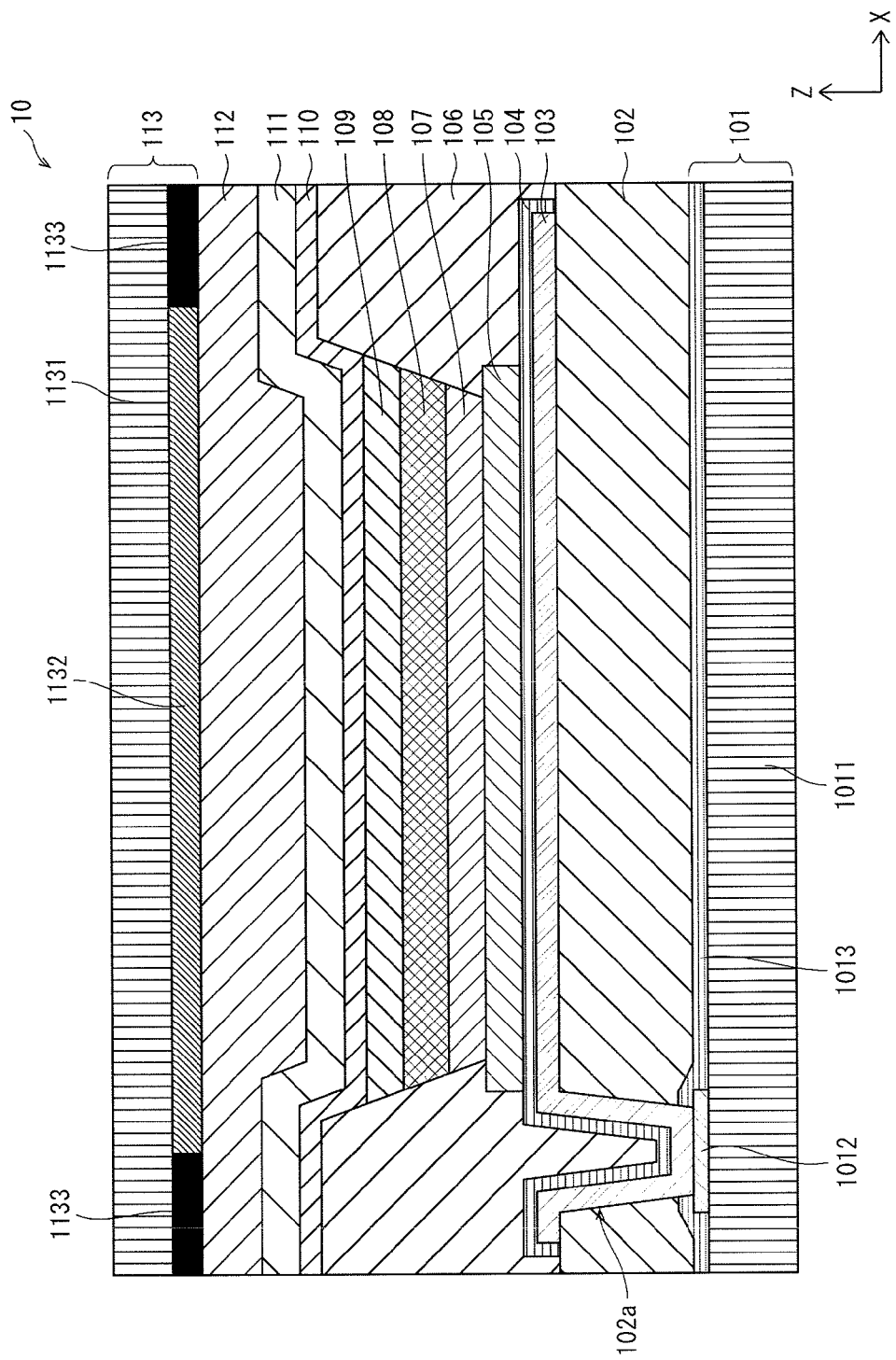
FIG. 2 is a schematic cross-sectional view showing part of the structure of a display panel 10 in the organic display device 1.
Figure 3:
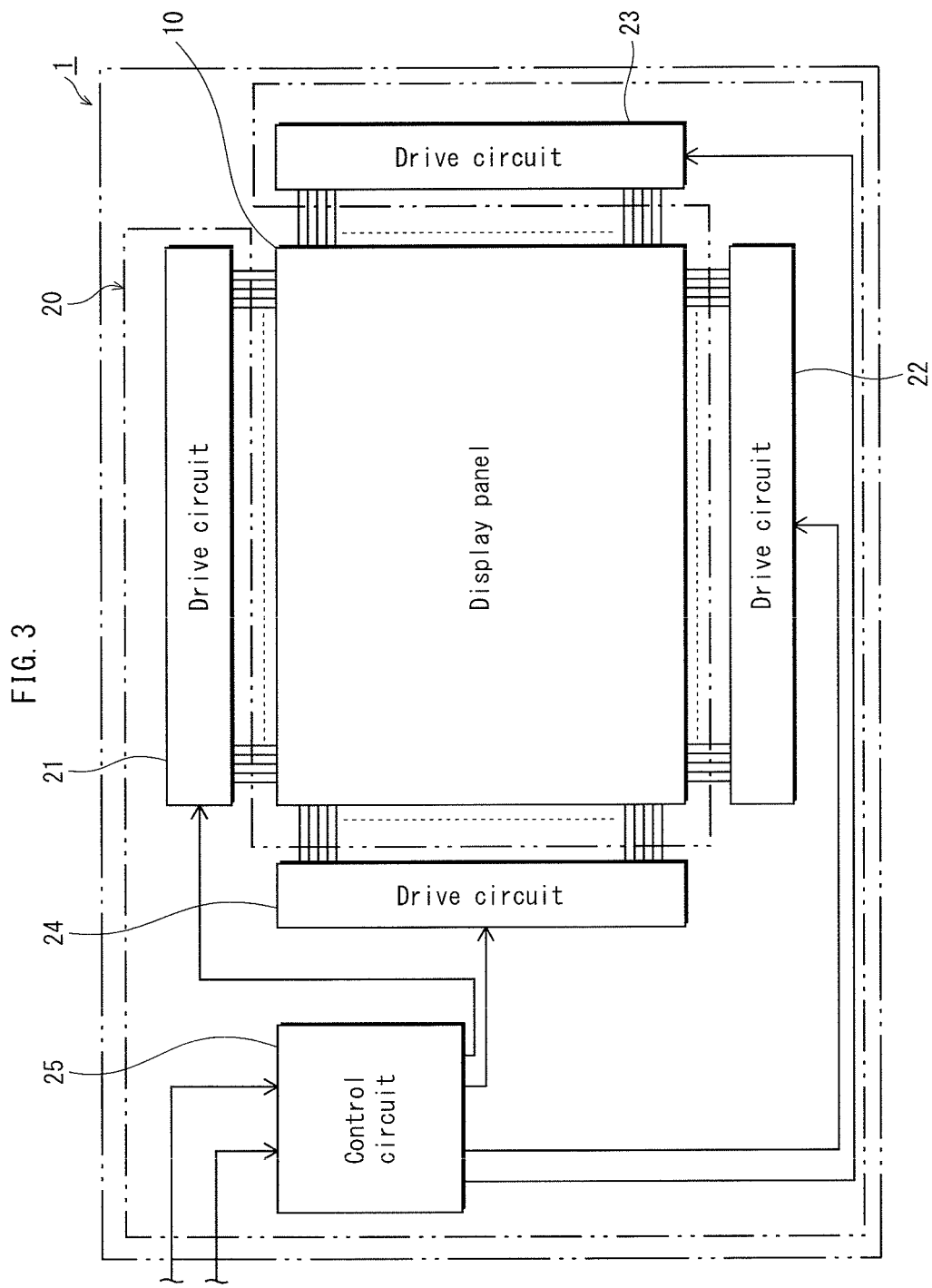
FIG. 3 is a schematic block diagram showing the structure of the organic display device 1.

The following describes a manufacturing method for an organic display device 1 according to the present embodiment, with reference to FIGS. 1 to 3.

First, as shown in FIG. 1, a TFT substrate is formed (step S101). As shown in FIG. 2, a TFT substrate 101 includes a substrate 1011, a TFT drain 1012, and a passivation film 1013. Electrodes serving as a gate, a source, and a drain are formed on the substrate 1011 in the Z-axis direction (in FIG. 2, only the TFT drain 1012 is shown). The passivation film 1013 covers the substrate 1011 on which the electrodes are formed, except a part of the top of the TFT drain 1012.

Next, as shown in FIG. 1, an insulating layer is formed on the TFT substrate 101 (step S102). As shown in FIG. 2, an insulating layer 102 has a contact hole 102a from which the top of the TFT drain 1012 is partially exposed. The top of the insulating layer 102 in the Z-axis direction is substantially planarized except the portion where the contact hole 102a is formed.

Next, as shown in FIG. 1, an anode is formed on the insulating layer 102 (step S103). As shown in FIG. 2, an anode 103 is partitioned in units of light emission (sub-pixels). Part of the anode 103 is provided along a side wall of the contact hole 102a and is connected to the TFT drain 1012. The anode 103 can be formed, for example, by forming a metal film with use of a sputtering method, a vacuum deposition method, or the like, and etching the metal film on a per sub-pixel basis.

Next, as shown in FIG. 1, a transparent conductive film is formed to cover the top surface of the anode 103 (step S104). As shown in FIG. 2, a transparent conductive film 104 covers not only the top surface of the anode 103 but also the side surfaces of the anode 103. Even within the contact hole 102a, the transparent conductive film 104 covers the top surface of the anode 103. Similarly to the case of the anode 103 above, the transparent conductive film 104 is formed by forming a film with use of a sputtering method, a vacuum deposition method, or the like, and etching the film on a per sub-pixel basis.

Next, as shown in FIG. 1, a hole injection layer is formed on a part of the top surface of the transparent conductive film 104 (step S105). As shown in FIG. 2, a hole injection layer 105 is formed on a part, but not the entirety, of the top surface of the transparent conductive film 104. However, the hole injection layer 105 may be formed on the entire top surface of the transparent conductive film 104.

Note that the hole injection layer 105 may be formed from metal oxide or organic material. Details of materials used to form the hole injection layer 105 are described below. In a case where the hole injection layer 105 is formed from metal oxide, a metal oxide film may be formed to partially cover a surface of the transparent conductive film 104 and an exposed surface of the insulating film 102. Then, the metal oxide film may be partitioned by etching on a per sub-pixel basis.

A metal oxide film (e.g., tungsten oxide film) for the hole injection layer 105 may be formed under the following conditions, for example: using a mixture of an argon gas and an oxygen gas, as a gas to be enclosed in a chamber of a sputtering device; the total pressure of the gas is greater than 2.7 Pa but not greater than 7.0 Pa, and the ratio of the partial pressure of the oxygen gas to the total pressure is from 50% to 70% inclusive; and the input electric power density per target unit area is from 1 W/cm$^2$ to 2.8 W/cm$^2$ inclusive.

As shown in FIG. 1, a bank defining each sub-pixel is formed (step S106). As shown in FIG. 2, a bank 106 partially covers an outer edge of the hole injection layer 105, and is formed on a portion of the transparent conductive film 104 and a portion of the insulating layer 102, which are not covered by the hole injection layer 105.

The bank 106 is formed as follows. First, a material layer for the bank 106 is formed on the outer surface of the hole injection layer 105, the transparent conductive film 104, and the insulating layer 102. This material layer is formed from, for example, a material containing a fluorine component and a photosensitive resin component, such as an acrylic resin, a polyimide resin, or a novolac-type phenolic resin, by a spin coat method or the like. For example, a negative photosensitive material manufactured by Zeon (product code: ZPN1168) can be used as the photosensitive resin material in the present embodiment.

Next, the material layer is patterned to form openings corresponding to the respective sub-pixels. The openings may be formed by providing a mask on a surface of the material layer, exposing the material layer to light through the mask, and then developing the material layer.

Next, as shown in FIGS. 1 and 2, within each recess that is defined by the bank 106 and that is on the hole injection layer 105, a hole transport layer 107, a light-emitting layer 108, and an electron transport layer 109 are formed in the stated order (steps S107, S108, S109 in FIG. 1).

The hole transport layer 107 is formed by forming a film made of an organic compound by a printing method and subsequently baking the film thus formed. Similarly, the light-emitting layer 108 is formed by forming a film by a printing method and subsequently baking the film thus formed.

Next, as shown in FIG. 1, a cathode and a sealing layer are formed on the electron transport layer 109 in the stated order (steps S110 and S111). As shown in FIG. 2, a cathode 110 and a sealing layer 111 are formed across the entire surface shown in FIG. 2 so as to also cover the top surface of the bank 106.

Next, as shown in FIG. 1, adhesive resin material is applied to the top surface of the sealing layer 111, and a CF (color filter) panel, which has been prepared in advance, is bonded to the sealing layer 111 with the adhesive resin material therebetween (steps S112 and S113). As shown in FIG. 2, a CF panel 113 bonded with an adhesive resin layer 112 includes a substrate 1131, a color filter 1132, and a black matrix 1133. The color filter 1132 and the black matrix 1133 are formed on a bottom surface of the substrate 1131 positioned downwards in the Z-axis direction.

Performance of the above steps completes a display panel 10.

Next, as shown in FIG. 3, a drive control unit 20 is provided for the display panel 10 (step S20 in FIG. 1). As shown in FIG. 3, the drive control unit 20 includes drive circuits 21 to 24 and a control circuit 25.

Finally, as shown in FIG. 1, an aging process is performed on the display panel 10 (step S30). The aging process is performed, for example, applying electric power until the mobility of holes is reduced to $\frac{1}{10}$ or less in comparison with the hole-injection properties before the aging process. Specifically, electric power is applied for predetermined duration so that the luminance of the display panel 10 is equal to or higher than the luminance during the practical use thereof but not higher than three times the luminance during the practical use thereof. The duration of the aging process is described below.

Performance of the above steps completes the organic display device 1 according to the present embodiment.

2. Materials Used for Display Panel 10

The components of the display panel 10 are formed with use of the following materials, for example.

(i) Substrate 1011

The substrate 1011 is formed with a base of an insulating material such as alkali-free glass, soda glass, nonfluorescent glass, phosphate glass, borate glass, quartz, acrylic resin, styrenic resin, polycarbonate resin, epoxy resin, polyethylene, polyester, silicone resin, or alumina.

(ii) Insulating Layer 102

The insulating layer 102 is formed with use of an organic compound, such as polyimide, polyimide, and acrylic resin.

(iii) Anode 103

The anode 103 is composed of a metal material containing Ag or Al. When the display panel 10 according to the present embodiment is of a top emission type, it is desirable that a surface of the display panel 10 have high reflectivity.

(iv) Transparent Conductive Film 104

The transparent conductive film 104 is formed with ITO (Indium Tin Oxide) or IZO (Indium Zinc Oxide), for example.

(v) Hole Injection Layer 105

The hole injection layer 105 is formed from oxide, such as silver (Ag), molybdenum (Mo), chromium (Cr), vanadium, (V), tungsten (W), nickel (Ni), and iridium (Ir), or alternatively, from a conductive polymer material such as PEDOT (a mixture of polythiophene and polystyrene sulfonate). In a case where the hole injection layer 105 is formed from metal oxide, the hole injection layer 105 has the function of assisting with electric charge (hole) generation and of injecting holes stably into the light-emitting layer 108. The hole injection layer 105 has a high work function.

In a case where the hole injection layer 105 is formed from transition metal oxide, a plurality of levels can be occupied since there are a plurality of oxidation numbers. This makes hole injection easy and allows for reduction of driving voltage. In particular, using tungsten oxide (WO$_x$) is desirable in terms of the fact that tungsten oxide can inject holes stably and has the function of assisting with hole generation.

(vi) Bank 106

The bank 106 is formed with organic material such as resin and has insulating properties. Examples of the organic material used to form the bank 106 include acrylic resin, polyimide resin, and novolac-type phenolic resin. It is desirable that the bank 106 have organic solvent resistance. Furthermore, since the bank 106 may undergo processes such as etching, baking, etc, when formed, it is desirable that the bank 106 be formed from highly resistant material that does not change excessively in shape or quality during such processes. To provide the bank 106 with liquid repellency, a surface thereof can be fluoridated.

Note that if a liquid-philic material is used to form the bank 106, the difference in liquid-affinity/liquid-repellency between a surface of the bank 106 and a surface of the light-emitting layer 108 becomes small, and it thus becomes difficult to selectively maintain the ink, which includes an organic substance for forming the light-emitting layer 108, at the opening defined by the bank 106.

The bank 106 does not necessarily have a single layer structure as shown in FIG. 2, but may have a two or more layered structure. In such a case, the above materials may be combined for each layer, or layers may alternate between non-organic and organic material.

(vii) Hole Transport Layer 107

The hole transport layer 107 is formed from a polymer not containing a hydrophilic group. For example, a polymer such as polyfluorene or a derivative thereof, or polyarylamine or a derivative thereof, that does not contain a hydrophilic group is used.

(viii) Light-Emitting Layer 108

As described above, the light-emitting layer 108 emits light when an excitation state is produced by the recombination of holes and electrons that have been injected. The material used to form the organic light-emitting layer 108 needs to be a light-emitting organic material, a film of which can be formed by a wet printing method.

Specifically, it is beneficial that the light-emitting layer 108 be formed from a fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of an 8-hydroxyquinoline compound, metal complex of a 2-bipyridine compound, complex of a Schiff base and a group three metal, metal complex of oxine, rare earth metal complex, etc., as recited in Japanese Patent Application Publication No. H5-163488.

(ix) Electron Transport Layer 109

The electron transport layer 109 transports, to the light-emitting layer 108, electrons injected from the cathode 110. For example, the electron transport layer 109 is formed from an oxadiazole derivative (OXD), a triazole derivative (TAZ), or a phenanthroline derivative (BCP, Bphen).

(x) Cathode 110

The cathode 110 is formed from ITO (Indium Tin Oxide) or IZO (Indium Zinc Oxide) for example. In the case of the top-emission type display panel 10 in the present embodiment, it is beneficial that the cathode be formed from a light-transmissive material. It is beneficial that the degree of light transmittance be 80% or greater.

Other than the materials described above, the cathode 110 may be formed with a layer including an alkali metal, a layer including an alkali earth metal, or a layer including either a halide of an alkali metal or a halide of an alkali earth metal. Alternatively, the cathode 110 may be formed with one of these layers and a layer including silver, which are layered in the stated order. The layer that includes silver may be formed with silver alone, or with a silver alloy. Also, in order to increase light-extraction efficiency, a highly transparent refraction index adjustment layer may be provided over the layer that includes silver.

(xi) Sealing Layer 111

The sealing layer 111 inhibits the light-emitting layer 108 and other organic layers from being exposed to moisture or air, and is formed from SiN (silicon nitride), SiON (silicon oxynitride), or the like. A sealing resin layer faulted from resin material such as acrylic resin or silicone resin may be provided over the layer that includes SiN (silicon nitride) or SiON (silicon oxynitride).

In the case of the top-emission type display panel 10 in the present embodiment, it is beneficial that the sealing layer 111 be formed from light-transmissive material.

3. Duration of Aging Process

The following describes a method for defining the duration of the aging process, which is included in the manufacturing process of the organic display device 1 according to the present embodiment, i.e., the duration of the application of electric power in step S30 of aging process, with reference to FIGS. 4 to 7.

In the aging process according to the present embodiment, a "duration determination element" is used to determine the duration of the aging process (duration of the application of electric power). Specifically, the duration determination element has the same structure as the organic display device 1 on which the aging process is to be performed. Based on the correlation between a degradation rate in the luminance of the element structure in the duration determination element and the degradation rate in the luminance of the light-emitting layer 108 in the duration determination element, the duration of the aging process (duration of the application of electric power) is determined.

(i) Method for Measuring the Luminance of Element Structure and Method for Measuring the Luminance of Light-Emitting Layer 108

Figure 4A:
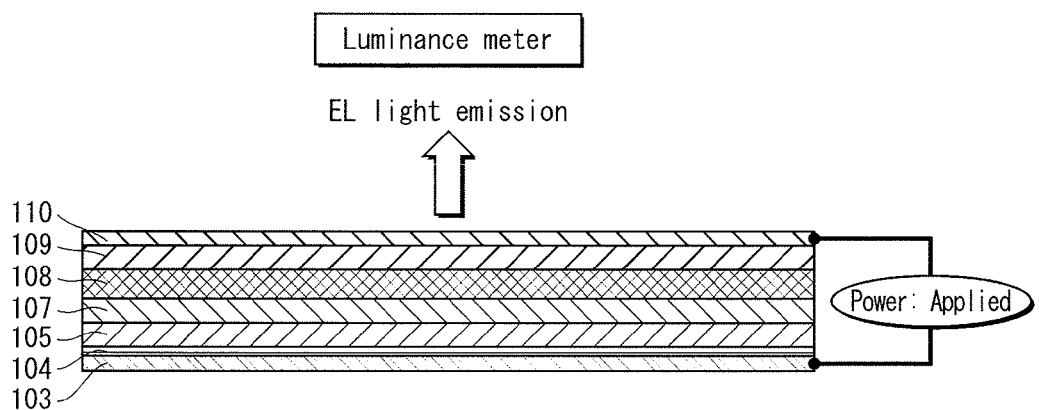
FIG. 4A is a schematic cross-sectional view showing a measurement method for obtaining a curve representing weakening of electric current.

As shown in FIG. 4A, electric power is applied between the anode 103 and the cathode 110 in the element structure. Then, the luminance of EL light emission by the application of electric power is measured with use of a luminance meter.

Figure 4B:
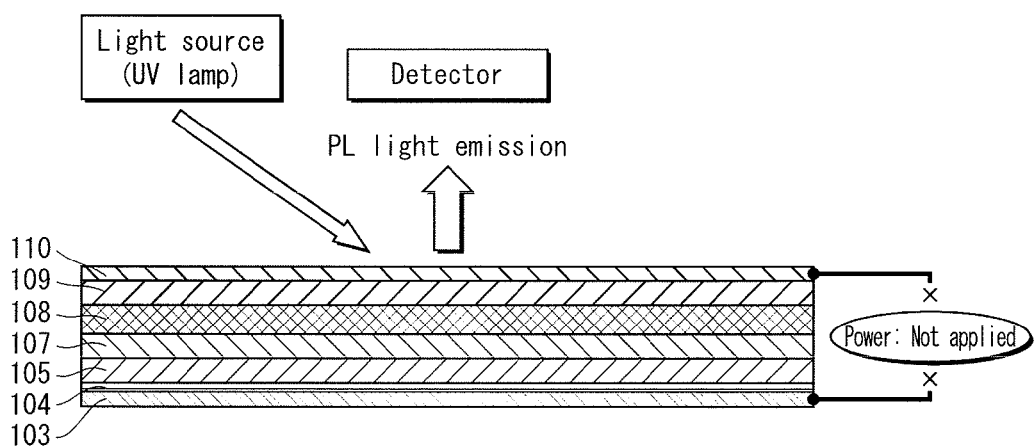
FIG. 4B is a schematic cross-sectional view showing a measurement method for obtaining a curve representing degradation of a light-emitting layer.

On the other hand, as shown in FIG. 4B, the luminance of the light-emitting layer 108 is measured as follows. First, the application of electric power between the anode 103 and the cathode 110 is temporarily stopped. In this state, the light-emitting layer 108 is irradiated with UV light from a light source (UV lamp). Then, the luminance of PL emission by the irradiation with UV light is detected by a detector. In other words, the luminance of PL light emission can be measured with use of a photoluminescence method.

According to the present embodiment, in order to determine the duration of the application of electric power in the aging process, the measurement of EL light emission and the measurement of PL light emission as described above are repeatedly conducted at predetermined intervals with respect to at least one organic display device in the same lot prior to the manufacturing of organic display devices.

Figure 5:
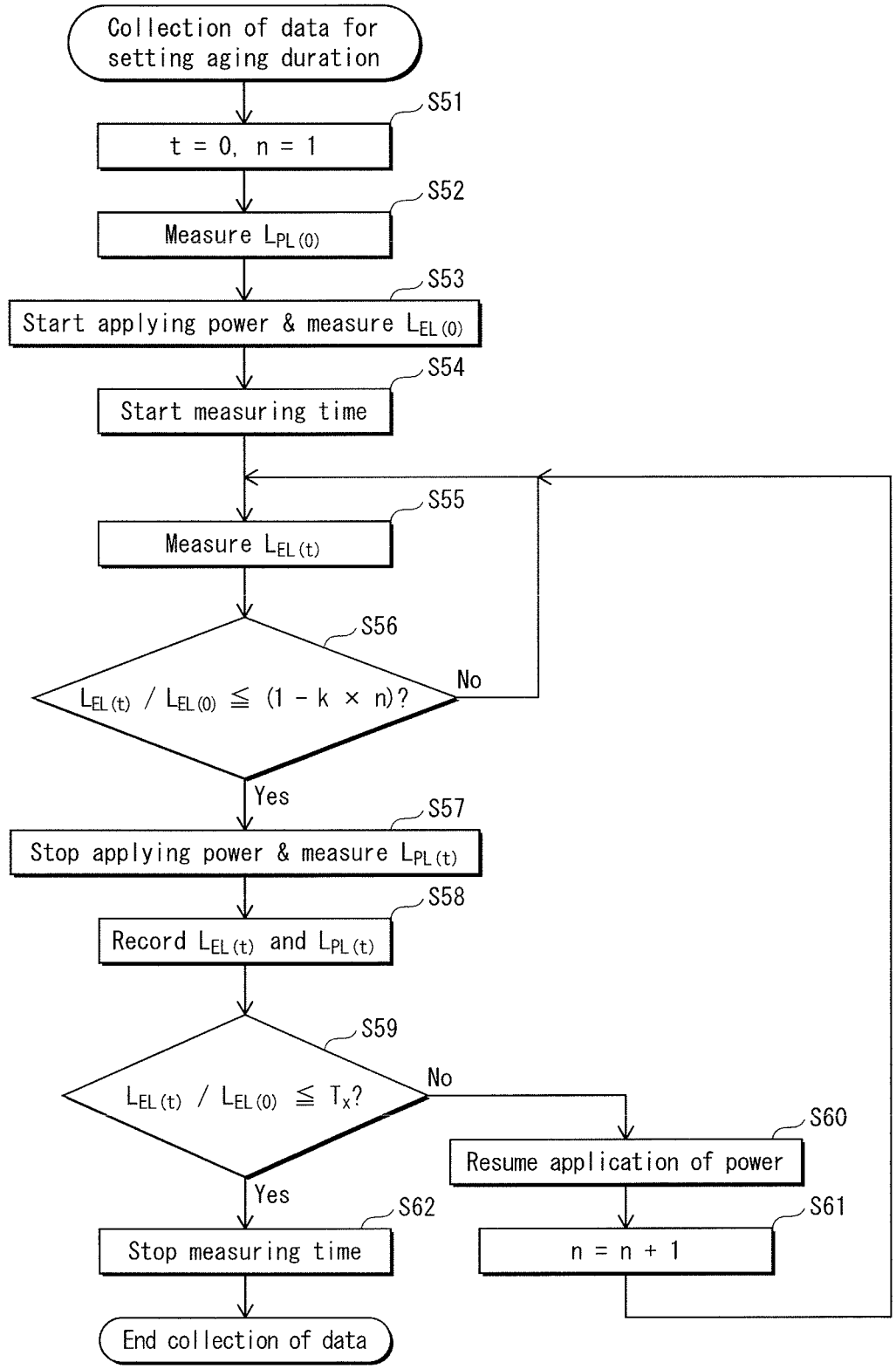
FIG. 5 shows a process flow for obtaining the curve representing the weakening of electric current, and the curve representing the degradation of the light-emitting layer.

(ii) Collection of Data for Determining Aging Duration, and Determination of Aging Duration As shown in FIG. 5, in the process of collecting data for setting the aging duration, first of all, a timer is reset (t=0) and a counter is reset (n=1) (step S51). Next, PL luminance $L_{PL(0)}$ when a time point t=0 is measured (step S52).

Next, electric power is applied between the anode 103 and the cathode 110, and the EL luminance of the element structure immediately after the application of electric power $L_{EL(0)}$ is measured (step S53). Then, the timer is activated to start measuring time (step S54).

While electric power is continually applied to the anode 103 and the cathode 110, EL luminance $L_{EL(t)}$ is measured at predetermined intervals (step S55). When the ratio of the EL luminance $L_{EL(t)}$ at each time point t with respect to the EL luminance $L_{EL(0)}$ immediately after the application of electric power ($L_{EL(t)}/L_{EL(0)}$) becomes (1−k×n), the application of electric power is temporarily stopped, and the PL luminance $L_{PL(t)}$ is measured (step S57).

In a case where (1−k×n) is set in steps of 10%, (1−k×n) is 90% when n=1, and is 80% when n=2. In a case where (1−k×n) is set in steps of 5%, (1−k×n) is 95% when n=1, 90% when n=2, and is 85% when n=3. The value of k can be determined in view of time and effort that increase in proportion to the frequency of the measurement and how detailed the collected data needs to be. For example, in the present embodiment, k is set to 0.1, and data is collected every time the value of the ratio $L_{EL(t)}/L_{EL(0)}$ decreases by 10%.

Next, the measured data pieces $L_{EL(t)}$ and $L_{PL(t)}$ are stored in a memory (step S58). When the ratio $L_{EL(t)}/L_{EL(0)}$ is equal to or less than a predetermined value Tx (step S59: Yes), measuring of time is stopped (step S62), and collecting of data is ended. The value Tx is determined in view of the workload acceptable for collecting of data, or the like. For example, the value Tx may be set to 50%. Alternatively, the value Tx may be set to a value lower than 50%, such as 30% or 10%.

When the ratio $L_{EL(t)}/L_{EL(0)}$ is greater than the value Tx (step S59: No), the application of electric power between the anode 103 and the cathode 110 is resumed (step S60). At the same time, the counter is set to n=n+1 (step S61). Then, the process from steps S55 to S59 is performed again.

(iii) Collected Data and Determination of Aging Duration

Figure 6:
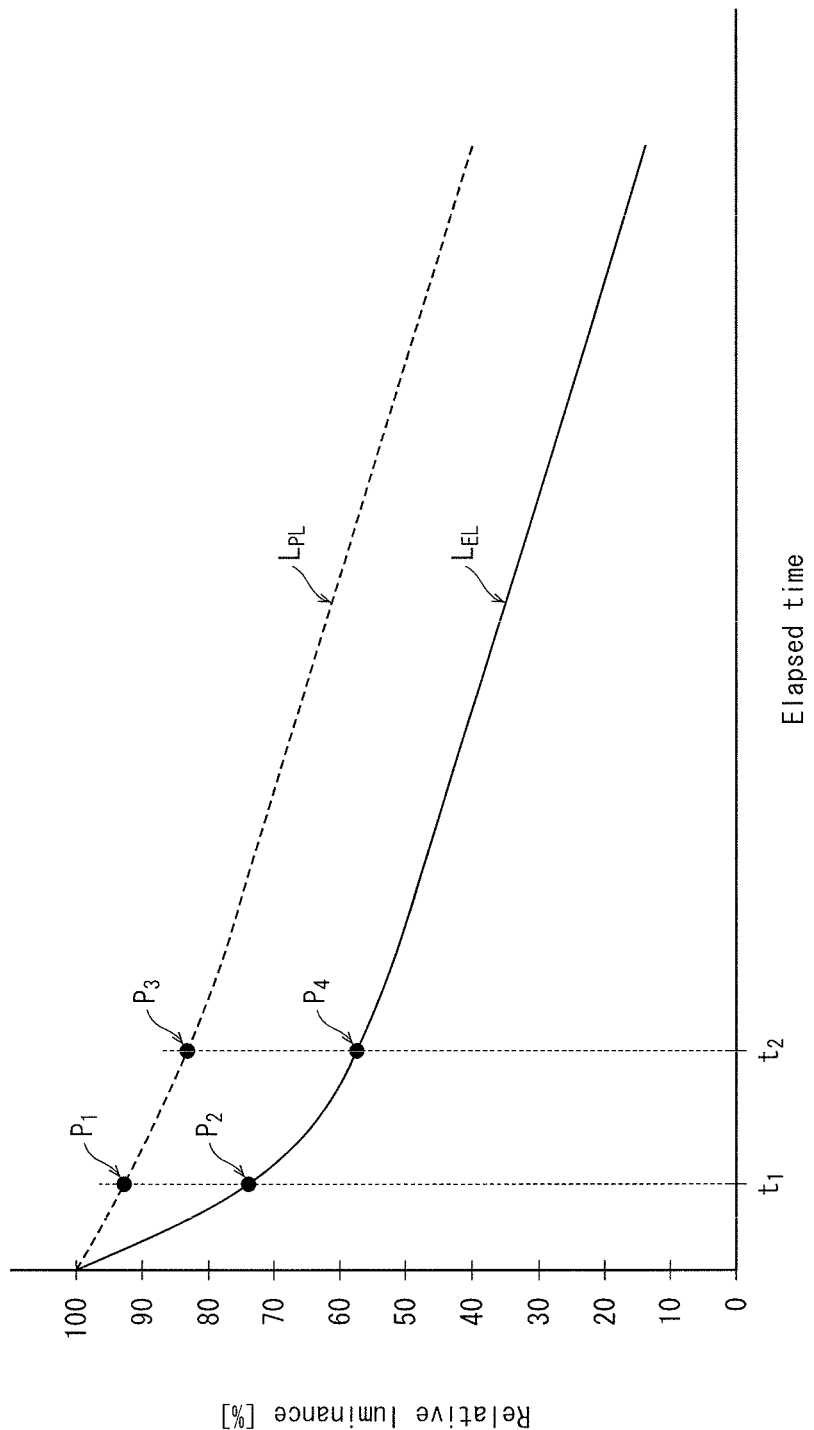
FIG. 6 is a schematic characteristic diagram illustrating the curve representing the weakening of electric current, and the curve representing the degradation of the light-emitting layer that have been obtained.

Data pieces obtained in the above process (i.e., data on the luminance of photoluminescence (PL) light emission and data on the luminance of electroluminescence (EL) light emission) are graphed as shown in FIG. 6. In the graph, the horizontal axis represents elapsed time, and the vertical axis represents relative luminance ($L_{EL(t)}/L_{EL(0)}$, $L_{PL(t)}/L_{PL(0)}$).

As shown in FIG. 6, the curve $L_{EL}$ of the relative luminance of the EL light emission changes exponentially to exhibit a sharp drop from the start of the application of electric power to the elapse of a certain period of time.

In contrast, the curve $L_{PL}$ of the relative luminance of the PL light emission does not exhibit a sharp drop even immediately after the application of electric power, unlike the curve $L_{EL}$ of the relative luminance of the EL light emission Rather, the curve $L_{PL}$ changes relatively gradually.

The determination of the aging duration (the duration of the application of electric power) is performed with a focus on the slopes of the curves $L_{EL}$ and $L_{PL}$. The time elapsed before the slopes of the curves $L_{EL}$ and $L_{PL}$ become substantially equal to each other is determined as the aging duration. Specifically, when a point $P_1$ and a point $P_2$, which correspond to a time point $t_1$, are compared to each other, the difference between the slope of the curve $L_{EL}$ and the slope of the curve $L_{PL}$ is greater than 20%. Accordingly, it cannot be said that the rate of decrease in the luminance of the EL light emission and the rate of decrease in the luminance of the PL light emission are "substantially equal to each other".

On the other hand, when a point $P_3$ and a point $P_4$, which correspond to a time point $t_2$, are compared to each other, the difference between the slope of the curve $L_{EL}$ and the slope of the curve $L_{PL}$ is equal to or less than 20%. Accordingly, it can be said that the rate of decrease in the luminance of the EL light emission and the rate of decrease in the luminance of the PL light emission are "substantially equal to each other". After the time point $t_2$, the slopes of the curves $L_{EL}$ and $L_{PL}$ maintain in a state of being "substantially equal to each other". Accordingly, the time elapsed before the time point $t_2$ is determined as the aging duration (the duration of the application of electric power).

As shown in FIG. 6, after the time point $t_2$, the curve $L_{EL}$ and the curve $L_{PL}$ maintain in a state of being substantially parallel to each other. Accordingly, it can be said that the life of the display panel 10 depends on the degradation of the light-emitting layer 108.

Note that in the present embodiment, the time elapsed before the time point $t_2$ at which the difference between the slope of the curve $L_{EL}$ and the slope of the curve $L_{PL}$ is equal to or less than 20% is determined as the aging duration. However, it is more beneficial, in view of stabilization of light-emitting properties and increase in lifetime, that the time elapsed before the time point at which the difference between the slopes of the curves $L_{EL}$ and $L_{PL}$ is equal to or less than 10% is determined to be the aging duration.

Note that the tendency in the degradation in luminance as shown in FIG. 6 does not change as long as the hole injection layer and the electron transport layer are each formed from a material suitable for the organic EL element.

4. Mechanism of Weakening

Figure 7B:
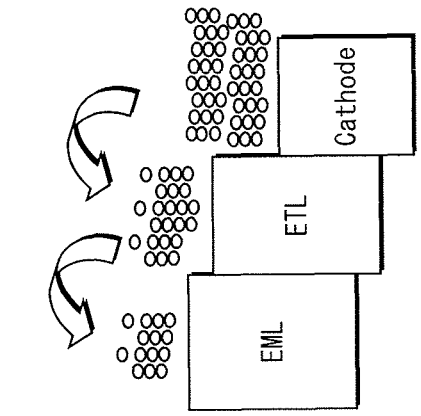
FIGS. 7A and 7B are each a schematic diagram illustrating a mechanism of the weakening of electric current, where

The mechanism of weakening of electric current in the organic light-emitting element is described below with reference to FIGS. 7A and 7B.

Figure 7A:
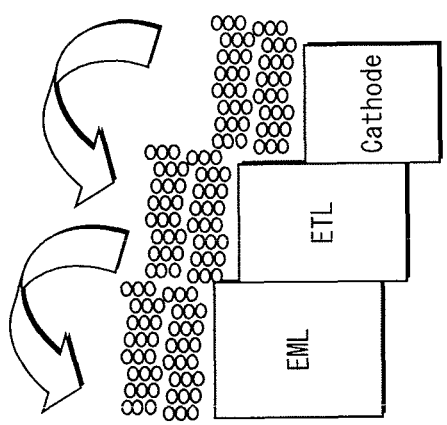

As shown in FIG. 7A, in the initial stage of the application of electric power, a large number of electrons move from the cathode to the light-emitting layer via the electron transport layer. However, as shown in FIG. 7B, after the initial stage, the carrier balance is disturbed by driving of the organic light-emitting element. This is considered to affect the inflow of electrons. As a result, it can be concluded that the number of electrons with respect to the light-emitting layer is reduced, causing a decrease in luminance.

In the present embodiment, weakening of the electron current is described as one example. However, there may be a case where hole current is weakened, and the present invention is applicable to such a case as well.

Embodiment 2

Figure 8:
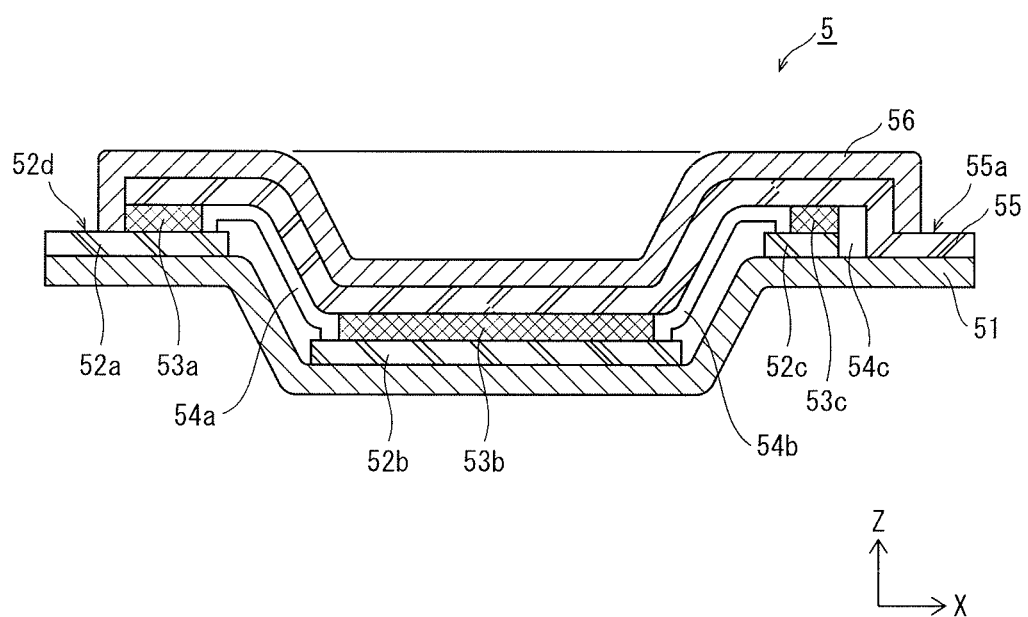
FIG. 8 is a schematic cross-sectional view showing the structure of an organic lighting device 5 according to Embodiment 2 of the present invention.

The following describes the structure of an organic lighting device 5 according to Embodiment 2, with reference to FIG. 8.

As shown in FIG. 8, the organic lighting device 5 includes a transparent substrate 51, a sealing cover 56, cathodes 52a, 52b, and 52c, an anode 55, and organic EL laminates 53a, 53b, and 53c. The cathodes 52a, 52b, and 52c, the anode 55 and the organic EL laminates 53a, 53b, and 53c are disposed in the space between the transparent substrate 51 and the sealing cover 56. The organic EL laminates 53a, 53b, and 53c are sandwiched between the cathodes 52a, 52b, and 52c and the anode 55. The cathodes 52a, 52b, and 52c are electrically connected to each other. A portion 52d of the cathode 52a extends outwards from the sealing cover 56. Note that the cathodes 52a, 52b, and 52c are made of transparent conductive material (e.g., ITO or IZO). The anode 55 is made of light-reflective material (e.g., Ag or Al).

A portion 55a of the anode 55 extends outwards from the sealing cover 56, at the side of the sealing cover 56 opposite the side from which the cathode 52a extends.

Each of the organic EL laminates 53a, 53b, and 53c has the same structure as the element structure (organic EL laminate) provided between the electrodes in the display panel 10 according to the Embodiment 1. The organic EL laminates 53a, 53b, and 53c are connected to each other via flexible insulators 54a and 54b inserted therebetween. Also, an insulator 54c is provided at the right end of the organic EL laminate 53c in the X-axis direction.

Note that each of the organic EL laminates 53a, 53b, and 53c in the organic lighting device 5 may include a bank for the purpose of, for example, uniformity in the thickness of each layer.

In the organic lighting device 5 according to the present embodiment, a portion of light emitted from the organic EL laminates 53a, 53b, and 53c is emitted directly downwards in the Z-axis direction, and passes through the cathodes 52a, 52b, and 52c. The remaining portion of light emitted from the organic EL laminates 53a, 53b, and 53c is emitted upwards in the Z-axis direction, reflected by the anode 55, and then emitted downwards in the Z-axis direction. In the final stage of manufacturing of the organic lighting device 5 according to the present embodiment, the aging process as described above is performed. Accordingly, the organic lighting device 5 also has an advantage of improving the lifetime. The duration of the aging process is determined in the same manner as described above.

Others

According to Embodiment 1, the anode 103 is disposed closer to the TFT substrate 101 than the light-emitting layer 108 is, and the cathode 110 is disposed at a side from which light is extracted. However, the anode 103 and the cathode 110 may be swapped around in position. When the anode 103 and the cathode 110 are swapped around in position, the cathode 110 disposed opposite the light extraction side with respect to the light-emitting layer 108 is formed to have the same structure as the anode 103. This realizes the same advantageous effect as described above. The same applies to the organic lighting device 5 according to Embodiment 2 above.

The display panel 10 according to Embodiment 1 above is a so-called top emission type display panel. However, the display panel 10 may be a bottom emission type display panel.

The constituent materials employed in Embodiments 1 and 2 above are merely examples, and may be changed appropriately to other materials. For example, the metal film constituting the anodes 103 and 55 is not necessarily made of pure Al or pure Ag. Instead, it may be made of an Al alloy including Al as a primary component or an Ag alloy including Ag as a primary component.

In the above embodiment, weakening of the electron current is described as one example. However, the present invention is applicable to a case where hole current is weakened, as described above.

The mechanism of weakening of electron current is as follows. As shown in FIG. 7A, in the initial stage of the application of electric power, a large number of electrons move from the cathode to the light-emitting layer via the electron transport layer. On the other hand, as shown in FIG. 7B, after the initial stage, the carrier balance is disturbed by driving of the organic light-emitting element. This is considered to affect the inflow of electrons. As a result, it can be concluded that the number of electrons with respect to the light-emitting layer is reduced, causing a decrease in luminance.

INDUSTRIAL APPLICABILITY

The present invention is useful in defining an optimum aging duration and performing an aging process for the optimum aging duration, thereby realizing an organic light-emitting element, an organic light-emitting device, an organic display panel, and an organic display device that have stable light-emitting properties and a long lifetime.

REFERENCE SIGNS LIST 1. organic display device
5. organic lighting device
10. display panel
20. drive control unit
21, 22, 23, 24. drive circuit
25. control circuit
51. transparent substrate
52a-52c. cathode
53a-53c. organic EL laminate
54a-54c. insulator
55. anode
56. sealing cover
101 TFT substrate
102. insulating layer
103. anode
104. transparent conductive film
105. hole injection layer
106. bank
107. hole transport layer
108. light-emitting layer
109. electron transport layer
110. cathode
111. sealing layer
112. adhesive resin layer
113 CF substrate
1011. substrate
1012. TFT drain
1013. passivation film
1131. substrate
1137. color filter
1133. black matrix

The invention claimed is:

1. A manufacturing method for an organic light-emitting element, the manufacturing method comprising:
forming a first electrode, and forming, in correspondence with the first electrode, an organic layer including a light-emitting layer;
forming a second electrode in correspondence with the organic layer, and thereby forming an element structure including the first electrode, the organic layer, and the second electrode; and
performing an aging process by applying electric power between the first electrode and the second electrode in the element structure, wherein
in the aging process, electric power is applied for a duration determined based on a rate of decrease in a luminance of photoluminescence light emission of the light-emitting layer and a rate of decrease in a luminance of electroluminescence light emission of the element structure, the photoluminescence light emission being a luminance of excitation light emitted from the light-emitting layer.

2. The manufacturing method of claim 1, wherein
in the aging process, electric power is applied until the rate of decrease in the luminance of photoluminescence light emission of the light-emitting layer is substantially equal to the rate of decrease in the luminance of electroluminescence light emission of the element structure.

3. The manufacturing method of claim 2, wherein
the duration of the application of electric power in the aging process is determined, with use of a duration determination element that differs from the organic light-emitting element subjected to the aging process and that has a same structure as the organic light-emitting element, by:
  measuring a luminance of photoluminescence light emission of a light-emitting layer of the duration determination element at predetermined intervals from a start of the application of electric power, and measuring a luminance of electroluminescence light emission of an element structure of the duration determination element at the predetermined intervals;
  based on a result of the measurement, calculating a rate of decrease in the luminance of photoluminescence light emission of the light-emitting layer of the duration determination element for each of the predetermined intervals, and calculating a rate of decrease in the luminance of electroluminescence light emission of the element structure of the duration determination element structure for each of the predetermined intervals; and
  calculating a time point at which the rate of decrease in the luminance of photoluminescence light emission of the light-emitting layer of the duration determination element is substantially equal to the rate of decrease in the luminance of electroluminescence light emission of the element structure of the duration determination element structure.

4. The manufacturing method of claim 1, wherein the aging process includes:
  measuring the luminance of electroluminescence light emission of the element structure while the electric power is applied; and
  measuring the luminance of photoluminescence light emission of the light-emitting layer while the electric power is not applied.

5. The manufacturing method of claim 4, wherein the measuring of the luminance of photoluminescence light emission of the light-emitting layer includes:
  irradiating the light-emitting layer with an ultraviolet lamp.

6. A manufacturing method for an organic light-emitting element, the manufacturing method comprising:
  forming a first electrode, and forming, in correspondence with the first electrode, an organic layer including a light-emitting layer;
  forming a second electrode in correspondence with the organic layer, and thereby forming an element structure including the first electrode, the organic layer, and the second electrode; and
  performing an aging process, by applying electric power between the first electrode and the second electrode in the element structure for a predetermined duration, wherein
  the predetermined duration in the aging process is determined, with use of a duration determination element that differs from the element structure subjected to the aging process and that has a same structure as the element structure, by:
  measuring a luminance of photoluminescence light emission of a light-emitting layer of the duration determination element at predetermined intervals from a start of the application of electric power, the photoluminescence light emission being a luminance of excitation light emitted from the light-emitting layer of the duration element, and measuring a luminance of electroluminescence light emission of an element structure of the duration determination element at the predetermined intervals;
  based on a result of the measurement, calculating a rate of decrease in the luminance of photoluminescence light emission of the light-emitting layer of the duration determination element for each of the predetermined intervals, and calculating a rate of decrease in the luminance of electroluminescence light emission of the element structure of the duration determination element structure for each of the predetermined intervals;
  calculating a time point at which the rate of decrease in the luminance of photoluminescence light emission of the light-emitting layer of the duration determination element is substantially equal to the rate of decrease in the luminance of electroluminescence light emission of the element structure of the duration determination element structure; and
  associating the predetermined duration in the aging process with the time point thus calculated.

7. An organic light-emitting device including an organic light-emitting element manufactured by a manufacturing method, the manufacturing method comprising:
  forming a first electrode, and forming, in correspondence with the first electrode, an organic layer including a light-emitting layer;
  forming a second electrode in correspondence with the organic layer, and thereby forming an element structure including the first electrode, the organic layer, and the second electrode; and
  performing an aging process by applying electric power between the first electrode and the second electrode in the element structure, wherein
  in the aging process, electric power is applied for a duration determined based on a rate of decrease in a luminance of photoluminescence light emission of the light-emitting layer and a rate of decrease in a luminance of electroluminescence light emission of the element structure the photoluminescence light emission being a luminance of excitation light emitted from the light-emitting layer.

8. An organic display panel including an organic light-emitting element manufactured by a manufacturing method, the manufacturing method comprising:
  forming a first electrode, and forming, in correspondence with the first electrode, an organic layer including a light-emitting layer;
  forming a second electrode in correspondence with the organic layer, and thereby forming an element structure including the first electrode, the organic layer, and the second electrode; and
  performing an aging process by applying electric power between the first electrode and the second electrode in the element structure, wherein
  in the aging process, electric power is applied for a duration determined based on a rate of decrease in a luminance of photoluminescence light emission of the light-emitting layer and a rate of decrease in a luminance of electroluminescence light emission of the element structure the photoluminescence light emission being a luminance of excitation light emitted from the light-emitting layer.

9. An organic display device including an organic light-emitting element manufactured by a manufacturing method, the manufacturing method comprising:
- forming a first electrode, and forming, in correspondence with the first electrode, an organic layer including a light-emitting layer;
- forming a second electrode in correspondence with the organic layer, and thereby forming an element structure including the first electrode, the organic layer, and the second electrode; and
- performing an aging process by applying electric power between the first electrode and the second electrode in the element structure, wherein
- in the aging process, electric power is applied for a duration determined based on a rate of decrease in a luminance of photoluminescence light emission of the light-emitting layer and a rate of decrease in a luminance of electroluminescence light emission of the element structure the photoluminescence light emission being a luminance of excitation light emitted from the light-emitting layer.

* * * * *